United States Patent
Harada et al.

(10) Patent No.: US 9,972,614 B2
(45) Date of Patent: May 15, 2018

(54) OVERHEAT DETECTION CIRCUIT AND POWER SUPPLY APPARATUS

(71) Applicant: SII Semiconductor Corporation, Chiba-shi, Chiba (JP)

(72) Inventors: Noriyuki Harada, Chiba (JP); Kaoru Sakaguchi, Chiba (JP)

(73) Assignee: ABLIC INC., Chiba (JP)

( * ) Notice: Subject to any disclaimer, the term of this patent is extended or adjusted under 35 U.S.C. 154(b) by 291 days.

(21) Appl. No.: 15/013,306

(22) Filed: Feb. 2, 2016

(65) Prior Publication Data

US 2016/0233208 A1    Aug. 11, 2016

(30) Foreign Application Priority Data

Feb. 3, 2015  (JP) ................. 2015-019470

(51) Int. Cl.
| | |
|---|---|
| G01K 7/00 | (2006.01) |
| H01L 27/02 | (2006.01) |
| G01K 3/00 | (2006.01) |
| G01K 7/01 | (2006.01) |
| H01L 23/64 | (2006.01) |

(52) U.S. Cl.
CPC .......... *H01L 27/0259* (2013.01); *G01K 3/005* (2013.01); *G01K 7/01* (2013.01); *H01L 23/647* (2013.01)

(58) Field of Classification Search
USPC .................................................. 374/170, 178
See application file for complete search history.

(56) References Cited

U.S. PATENT DOCUMENTS

| | | | | |
|---|---|---|---|---|
| 5,291,073 A | * | 3/1994 | Lewandowski | G01R 21/02 324/106 |
| 5,955,793 A | * | 9/1999 | Khadkikar | G01K 3/005 307/117 |
| 8,451,571 B2 | | 5/2013 | Imura et al. | |

* cited by examiner

*Primary Examiner* — Mirellys Jagan
(74) *Attorney, Agent, or Firm* — Brinks Gilson & Lione (57) ABSTRACT

Provided is an overheat detection circuit having a small circuit scale, low cost, and low electric power consumption. The overheat detection circuit implemented in a CMOS semiconductor device includes: a reference voltage circuit connected between a base and an emitter of a parasitic bipolar transistor; and a current detection circuit connected to the emitter of the parasitic bipolar transistor, in which the current detection circuit is configured to detect a flow of a current through the parasitic bipolar transistor to output an overheat detection signal.

5 Claims, 7 Drawing Sheets

OVERHEAT DETECTION CIRCUIT AND POWER SUPPLY APPARATUS

RELATED APPLICATIONS

This application claims priority under 35 U.S.C. § 119 to Japanese Patent Application No. 2015-019470 filed on Feb. 3, 2015, the entire content of which is hereby incorporated by reference.

BACKGROUND OF THE INVENTION

1. Field of the Invention

The present invention relates to an overheat detection circuit to be used for a power supply apparatus, or the like.

2. Description of the Related Art

Figure 7:
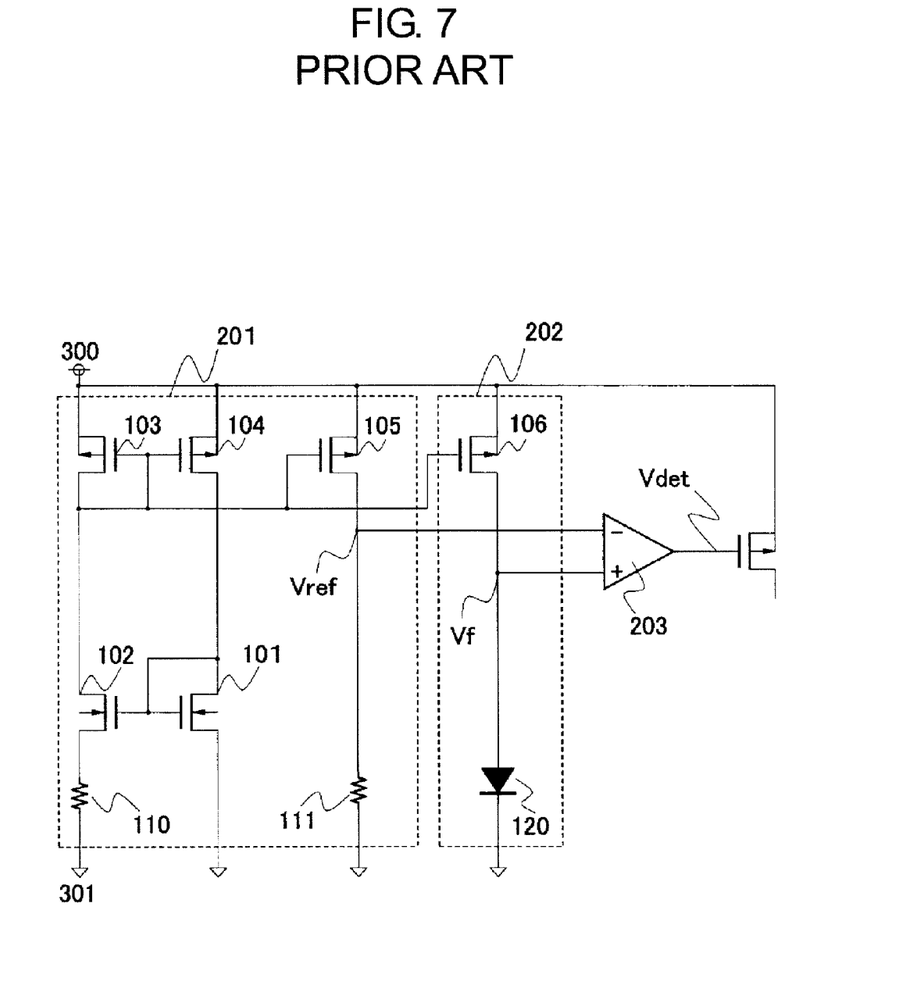
FIG. 7 is a diagram for illustrating a related-art overheat detection circuit.

FIG. 7 is a circuit diagram for illustrating a related-art overheat detection circuit to be used for a power supply apparatus or the like. The related-art overheat detection circuit includes a reference voltage circuit 201, a temperature sensing circuit 202, a comparator circuit 203, a power supply terminal 300, and a ground terminal 301.

The reference voltage circuit 201 includes NMOS transistors 101 and 102, PMOS transistors 103, 104, and 105, and resistors 110 and 111. The temperature sensing circuit 202 includes a PMOS transistor 106 and a diode 120.

The NMOS transistor 101 has a gate and a drain connected to each other, and has a source connected to the ground terminal 301. The NMOS transistor 102 has a gate connected to the gate of the NMOS transistor 101. The resistor 110 is connected between a source of the NMOS transistor 102 and the ground terminal 301. The PMOS transistors 103, 104, and 105 form a current mirror circuit. The resistor 111 is connected between a drain of the PMOS transistor 105 and the ground terminal 301. Then, a reference voltage Vref is output from a contact point (reference voltage output terminal) of the resistor 111 and the PMOS transistor 105. In this case, the resistor 110 and the resistor 111 have the same temperature coefficient.

The PMOS transistor 106 and the PMOS transistor 103 form a current mirror circuit. The diode 120 serving as a heat sensitive element is connected between a drain of the PMOS transistor 106 and the ground terminal 301. Then, a forward voltage of the diode 120, namely, a temperature voltage Vf is output from a contact point (temperature voltage output terminal) of the diode 120 and the PMOS transistor 106.

The reference voltage Vref is input to an inverted input terminal of the comparator circuit 203 and the temperature voltage Vf is input to a non-inverted input terminal of the comparator circuit 203. The forward voltage of the diode, namely, the temperature voltage Vf generally has a negative temperature coefficient of approximately $-2$ mV/° C. when a parasitic diode of a CMOS process is used. The reference voltage Vref is set to be equal to the temperature voltage Vf corresponding to a temperature to be detected. The overheat detection circuit is configured to compare the reference voltage Vref and the temperature voltage Vf with each other to obtain a magnitude relationship thereof through use of the comparator circuit 203, to thereby detect an overheat state.

When detecting the overheat state, the comparator circuit 203 outputs a detection signal Vdet and controls an output transistor and the like of the power supply apparatus based on the detection signal Vdet, to thereby protect the power supply apparatus from the overheat.

However, the related-art overheat detection circuit is required to include the reference voltage circuit, the temperature sensing circuit, and the comparator circuit, and thus has a large circuit scale. Further, there is a problem in that each circuit constantly consumes a current and thus it is difficult to reduce the electric power consumption.

SUMMARY OF THE INVENTION

The present invention has been made to solve the above-mentioned problems and provides an overheat detection circuit having a small circuit scale and enabling low electric power consumption.

An overheat detection circuit implemented in a CMOS semiconductor device according to one embodiment of the present invention includes: a parasitic bipolar transistor; a reference voltage circuit connected between a base and an emitter of the parasitic bipolar transistor; and a current detection circuit connected to the emitter of the parasitic bipolar transistor, in which the current detection circuit is configured to detect a flow of a collector current through the parasitic bipolar transistor to output an overheat detection signal.

The overheat detection circuit according to the one embodiment of the present invention has a small circuit scale and has only one path through which the current constantly flows when the overheat state is not detected, thereby achieving an effect that the electric power consumption can easily be reduced.

Further, it is possible to employ an inexpensive CMOS process by using a parasitic bipolar transistor and thus suppress the cost at a low level.

DETAILED DESCRIPTION OF THE PREFERRED EMBODIMENTS

Figure 1:
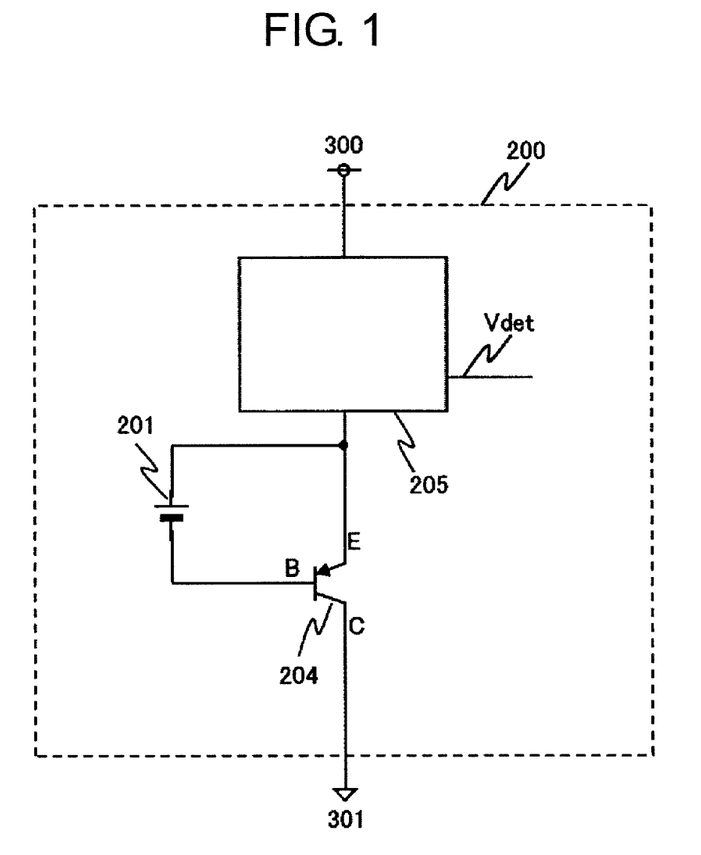
FIG. 1 is a block diagram for illustrating an overheat detection circuit according to an embodiment of the present invention.

FIG. 1 is a block diagram for illustrating an overheat detection circuit according to an embodiment of the present invention.

The overheat detection circuit 200 according to this embodiment includes a reference voltage circuit 201, a parasitic bipolar transistor 204, and a current detection circuit 205. The overheat detection circuit according to this embodiment is realized by actively utilizing the parasitic bipolar transistor as a temperature sensing element in a CMOS process.

The reference voltage circuit 201 is connected between a base and an emitter of the parasitic bipolar transistor 204.

The parasitic PNP bipolar transistor 204 has a collector electrically connected to a p-type substrate. This connection may be through a diffused resistor or a well resistor.

Figure 2:
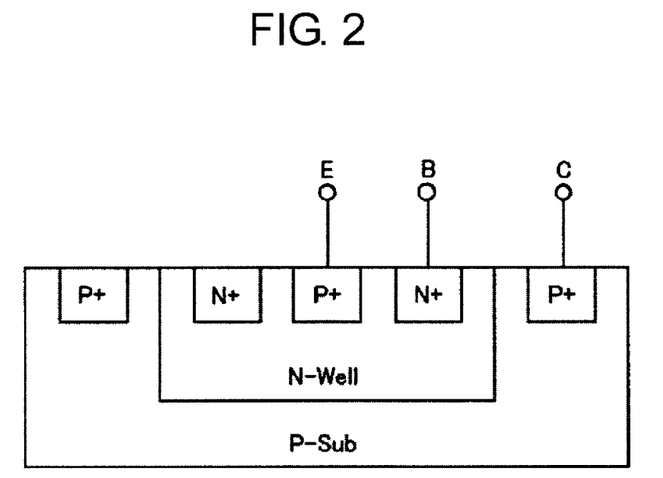
FIG. 2 is a view for illustrating an example of a cross-sectional structure of a parasitic bipolar transistor of the overheat detection circuit according to this embodiment.

FIG. 2 is a view for illustrating an example of a cross-sectional structure of a parasitic bipolar transistor of the overheat detection circuit 200 according to this embodiment. The current detection circuit 205 is connected to the emitter of the parasitic bipolar transistor 204.

Now, an operation of the overheat detection circuit 200 according to this embodiment is described.

The reference voltage circuit 201 outputs a reference voltage Vref. The reference voltage Vref is applied between the base and the emitter of the parasitic bipolar transistor 204. In general, a base-emitter voltage to turn the bipolar transistor on has a negative temperature coefficient of approximately −2 mV/° C. At normal temperature, the reference voltage Vref is set to be lower than the base-emitter voltage to turn the parasitic bipolar transistor 204 on. When the temperature is lower than a predetermined value, the reference voltage Vref is lower than a base-emitter voltage Vbe to turn the parasitic bipolar transistor 204 on, and thus the parasitic bipolar transistor 204 is off. When the temperature rises and the reference voltage Vref becomes equal to or more than the base-emitter voltage Vbe to turn the parasitic bipolar transistor 204 on, the parasitic bipolar transistor 204 is turned on to cause a collector current Ic to flow through the parasitic bipolar transistor 204. The current detection circuit 205 is formed of an impedance element and an output terminal, and detects the overheat state based on an increase in the collector current Ic flowing through the parasitic bipolar transistor 204.

Now, the overheat detection circuit 200 according to this embodiment is described using an example of a specific circuit.

Figure 3:
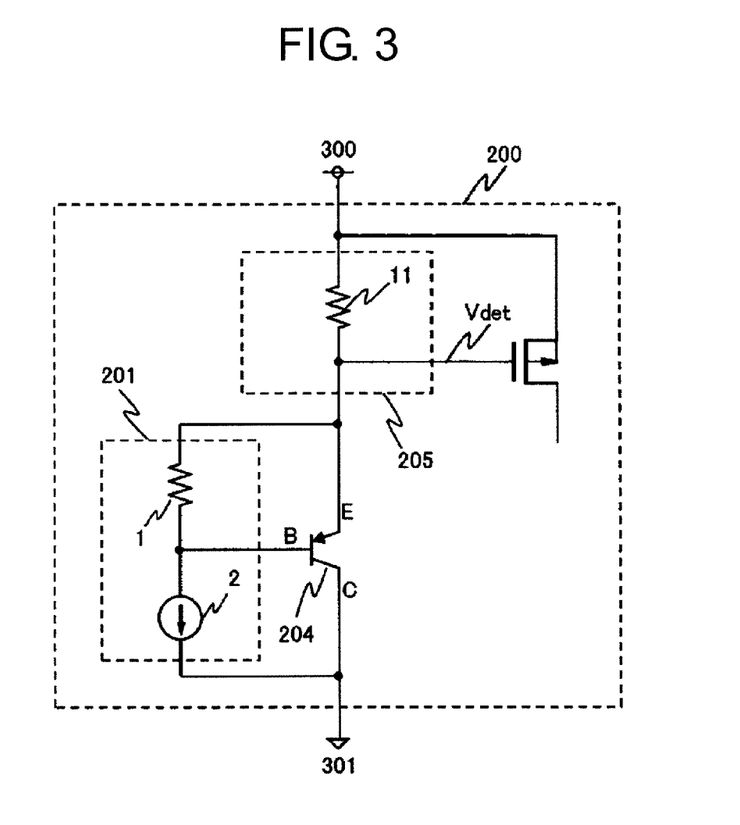
FIG. 3 is a circuit diagram for illustrating an example of the overheat detection circuit according to this embodiment.

FIG. 3 is a circuit diagram for illustrating an example of the overheat detection circuit according to this embodiment.

The overheat detection circuit 200 of FIG. 3 includes the reference voltage circuit 201, the parasitic bipolar transistor 204, and the current detection circuit 205. The reference voltage circuit 201 includes a constant current supply 2 and a resistor 1. The current detection circuit 205 includes a resistor 11.

In the reference voltage circuit 201, the resistor 1 is connected between the base and the emitter of the parasitic bipolar transistor 204, and the constant current supply 2 is connected between the base of the parasitic bipolar transistor 204 and the ground terminal 301. The current detection circuit 205 is connected between the power supply terminal 300 and the emitter of the parasitic bipolar transistor 204 in series.

Next, the operation of the overheat detection circuit 200 of FIG. 3 is described.

The reference voltage circuit 201 outputs the reference voltage Vref. When the resistor value of the resistor 1 is R1, the current value of the constant current supply 2 is Iref, and the base-emitter voltage to turn the parasitic bipolar transistor 204 on is Vbe, the reference voltage Vref is represented by Expression 1.

$$Vref = Iref \cdot R1 \qquad (1)$$

When the temperature is lower than the predetermined value, Vref<Vbe is satisfied, and the parasitic bipolar transistor 204 is off. When the temperature rises and Vref=Vbe is satisfied, the parasitic bipolar transistor 204 is turned on to cause the collector current Ic to flow therethrough. When a current amplification factor of the parasitic bipolar transistor 204 is hFE, the collector current Ic is represented by Expression 2.

$$Ic = hFE \cdot (Iref - Vbe/R1) \qquad (2)$$

The current detection circuit 205 detects the increase in the collector current Ic of the parasitic bipolar transistor 204 to output an overheat detection voltage Vdet. When the voltage of the power supply terminal 300 is Vdd, and the resistor value of the resistor 11 is R11, the overheat detection voltage Vdet is represented by Expression (3).

$$Vdet = Vdd - R11 \cdot Ic \qquad (3)$$

When the temperature is lower than the predetermined value, the overheat detection voltage Vdet is in a high level. When the temperature reaches the predetermined temperature, the overheat detection voltage Vdet is in a low level, to thereby detect the overheat state.

As described above, it is possible to construct the temperature detection circuit according to this embodiment by utilizing the parasitic bipolar transistor as a temperature sensing element in the CMOS process, and hence the circuit scale can be reduced.

Figure 4:
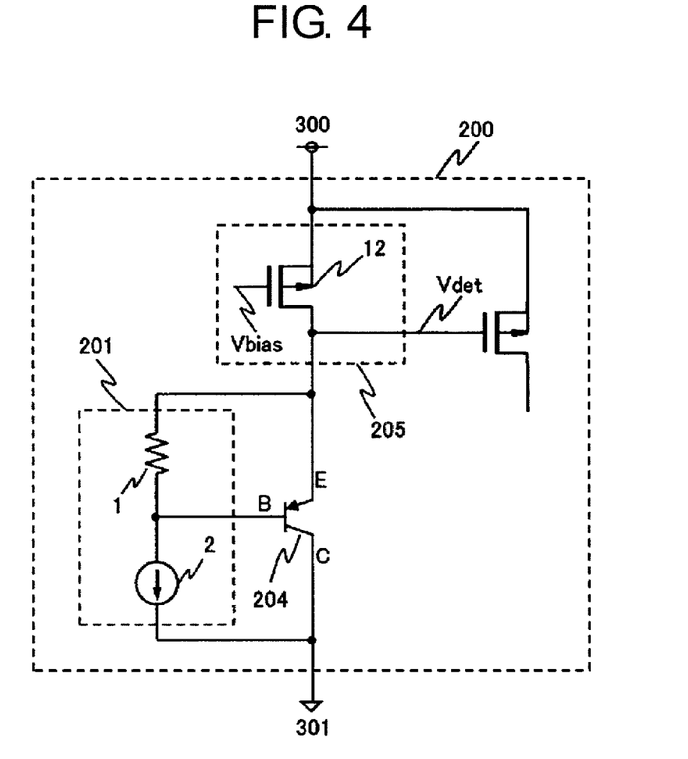
FIG. 4 is a circuit diagram for illustrating another example of the overheat detection circuit according to this embodiment.

FIG. 4 is a circuit diagram for illustrating another example of the overheat detection circuit according to this embodiment.

This circuit is different from the overheat detection circuit of FIG. 3 in that the resistor 11 of the current detection circuit 205 is replaced with a PMOS transistor 12.

The PMOS transistor 12 has a source connected to the power supply terminal 300 and a drain connected to the emitter of the parasitic bipolar transistor 204.

The PMOS transistor 12 has its gate and source biased at a constant voltage Vbias, and operates as a constant current source. The overheat detection voltage Vdet is determined by a magnitude relationship of a drain current Id of the PMOS transistor 12 and the collector current Ic of the parasitic bipolar transistor 204. When the temperature is lower than the predetermined temperature, Ic<Id is satisfied and the overheat detection voltage Vdet is in a high level. When the temperature rises and Ic>Id is satisfied, the Vdet is in a low level, resulting in detection of the overheat state.

Figure 5:
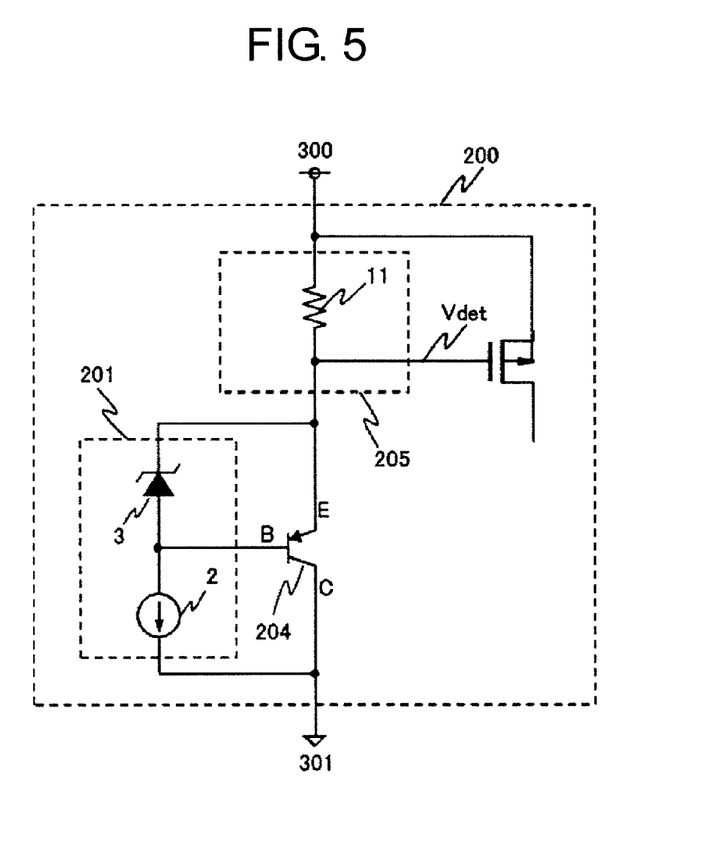
FIG. 5 is a circuit diagram for illustrating still another example of the overheat detection circuit according to this embodiment.

FIG. 5 is a circuit diagram for illustrating still another example of the overheat detection circuit according to this embodiment.

This circuit is different from the overheat detection circuit of FIG. 3 in that the resistor 1 of the reference voltage circuit 201 is replaced with a zener diode 3.

The zener diode 3 has an anode connected to the base of the parasitic bipolar transistor 204 and a cathode connected to the emitter of the parasitic bipolar transistor.

The reference voltage Vref here is a voltage across the zener diode 3, namely, a zener voltage Vz. When the temperature rises and Vref>Vbe is satisfied, the overheat state is detected.

Figure 6:
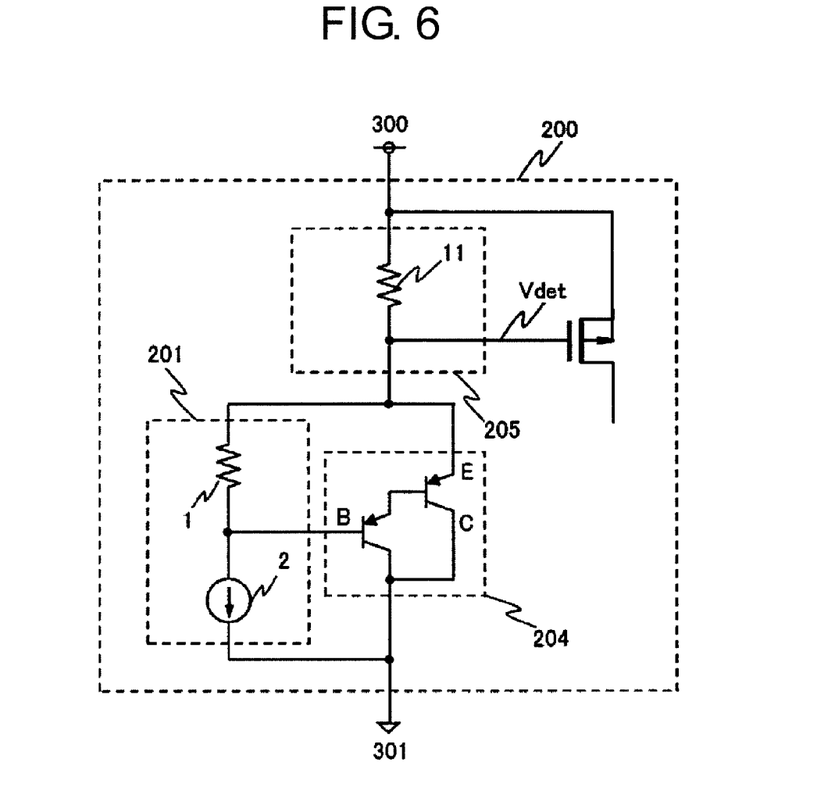
FIG. 6 is a circuit diagram for illustrating yet another example of the overheat detection circuit according to this embodiment.

FIG. 6 is a circuit diagram for illustrating yet another example of the overheat detection circuit according to this embodiment.

This circuit is different from the overheat detection circuit of FIG. 3 in that the parasitic bipolar transistor 204 is formed of a plurality of Darlington connected parasitic bipolar transistors. FIG. 6 is an illustration of an example of two Darlington connected parasitic bipolar transistors, but more than two parasitic bipolar transistors may be Darlington connected.

Note that, the reference voltage circuit 201 may be configured such that the resistor value of the resistor 1 is allowed to be changed by such means as laser trimming to adjust the overheat detection temperature.

Further, the overheat detection temperature may have a hysteresis characteristic by configuring the reference voltage circuit 201 and the current detection circuit 205 such that the resistor 1, the constant current supply 2, the resistor 11, and the like are allowed to be changed by the overheat detection signal.

Further, a description is given above of the parasitic PNP bipolar transistor 204, but the same effect can be achieved by using a parasitic NPN bipolar transistor with a reverse polarity configuration.

As described above, the overheat detection circuit according to this embodiment achieves reduction of the circuit scale and has only one path through which the current constantly flows when the overheat state is not detected by utilizing the parasitic bipolar transistor as a temperature sensing element in the CMOS process, thereby achieving an effect that the electric power consumption can be reduced.

Further, it would be apparent that the present invention is not limited to the circuit configuration illustrated in this embodiment, but covers a range that can be easily expected from the known art by a person skilled in the art.

Further, it is possible to construct an overheat protection circuit having a small circuit scale and a low current consumption by configuring the overheat detection circuit according to this embodiment such that the overheat detection circuit detects the overheat state of the power supply apparatus and then uses this detection signal to control the gate of the output transistor of the power supply apparatus.

What is claimed is:

1. An overheat detection circuit implemented in a CMOS semiconductor device, comprising:
   a parasitic bipolar transistor;
   a reference voltage circuit connected between a base and an emitter of the parasitic bipolar transistor; and
   a current detection circuit formed of an impedance element and an output terminal and connected to the emitter of the parasitic bipolar transistor,
   wherein the current detection circuit is configured to detect a flow of a collector current through the parasitic bipolar transistor to output an overheat detection signal.

2. An overheat detection circuit according to claim 1, wherein the reference voltage circuit is configured to apply, between the base and the emitter of the parasitic bipolar transistor, a voltage at which the collector current does not flow through the parasitic bipolar transistor at a predetermined temperature or less.

3. An overheat detection circuit according to claim 1, wherein the current detection circuit comprises a resistor as the impedance element.

4. An overheat detection circuit according to claim 1, wherein the current detection circuit comprises a MOS transistor in which a bias voltage is applied to a gate as the impedance element.

5. A power supply apparatus, comprising the overheat detection circuit of claim 1 as an overheat protection circuit.

* * * * *